(12) United States Patent
Satoh

(10) Patent No.: US 11,309,386 B2
(45) Date of Patent: Apr. 19, 2022

(54) SEMICONDUCTOR DEVICE

(71) Applicant: Mitsubishi Electric Corporation, Tokyo (JP)

(72) Inventor: Katsumi Satoh, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 56 days.

(21) Appl. No.: 17/014,422

(22) Filed: Sep. 8, 2020

(65) Prior Publication Data

US 2021/0151562 A1 May 20, 2021

(30) Foreign Application Priority Data

Nov. 20, 2019 (JP) .............................. JP2019-209533

(51) Int. Cl.
*H01L 29/06* (2006.01)
*H01L 29/08* (2006.01)
*H01L 29/739* (2006.01)

(52) U.S. Cl.
CPC ........ *H01L 29/0684* (2013.01); *H01L 29/083* (2013.01); *H01L 29/7397* (2013.01)

(58) Field of Classification Search
CPC .......................... H01L 29/0684; H01L 29/0619
See application file for complete search history.

(56) References Cited

U.S. PATENT DOCUMENTS

| | | | |
|---|---|---|---|
| 7,847,345 B2 * | 12/2010 | Takahashi | ........... H01L 29/0839 |
| | | | 257/330 |
| 2015/0123165 A1 | 5/2015 | Omura et al. | |
| 2017/0047322 A1 * | 2/2017 | Yoshida | ................ H01L 29/739 |
| 2018/0033885 A1 * | 2/2018 | Okumura | ............ H01L 29/0684 |

FOREIGN PATENT DOCUMENTS

JP 6288678 B2 3/2018

* cited by examiner

*Primary Examiner* — Raj R Gupta
(74) *Attorney, Agent, or Firm* — Studebaker & Brackett PC

(57) ABSTRACT

Each of a plurality of IGBT cells includes an n base layer formed in a semiconductor layer, a p base layer formed in a surface portion of the n base layer on a side of the first main surface, an n emitter layer formed in a surface portion of the p base layer, and a p collector layer formed in a surface portion of the semiconductor layer on a side of the second main surface. On a first main surface of the semiconductor layer, a gate electrode and an emitter electrode are formed. On a second main surface of the semiconductor layer, a collector electrode is formed. A pitch of the plurality of IGBT cells is $1/40$ or more and $1/20$ or less of a distance between the p base layer and the p collector layer.

14 Claims, 11 Drawing Sheets

F I G. 3
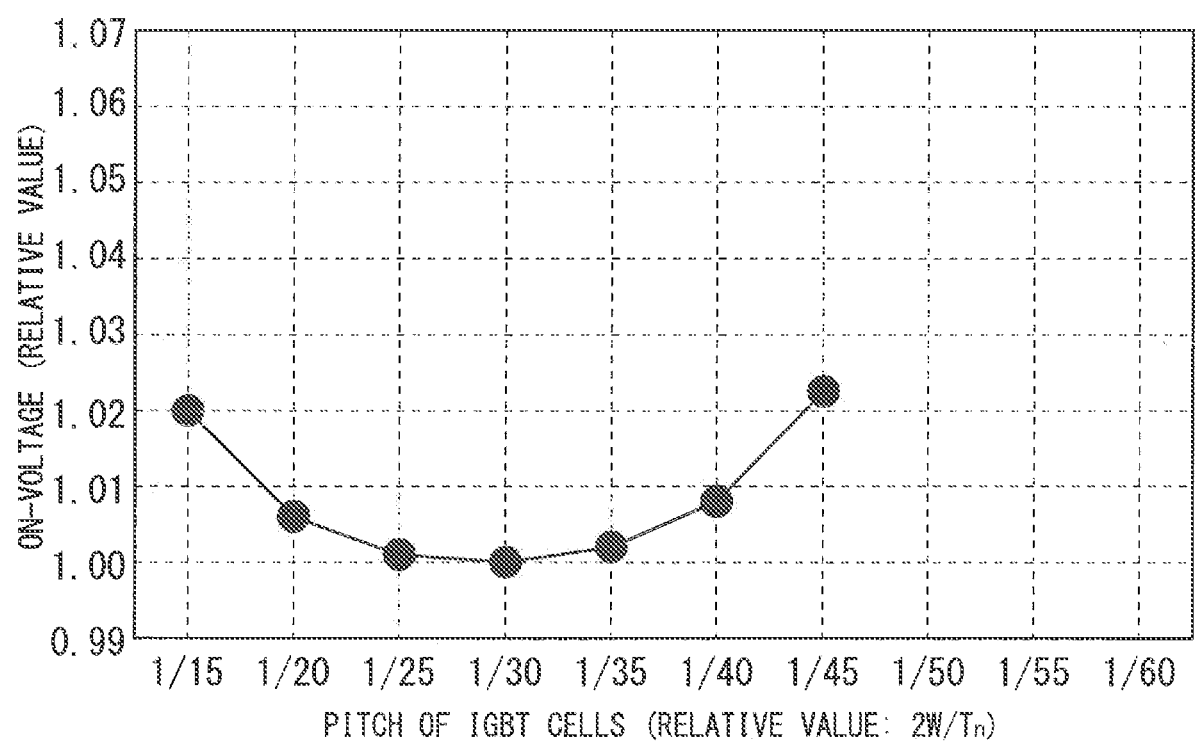

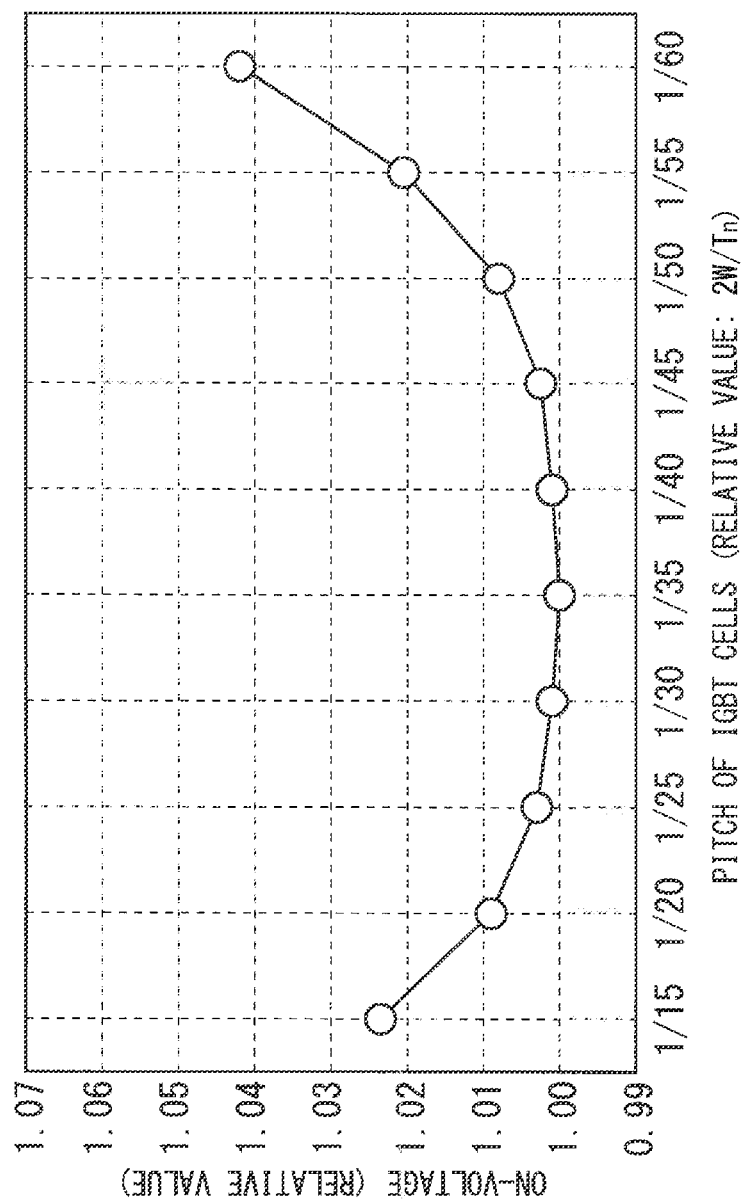
F I G. 5

F I G. 7
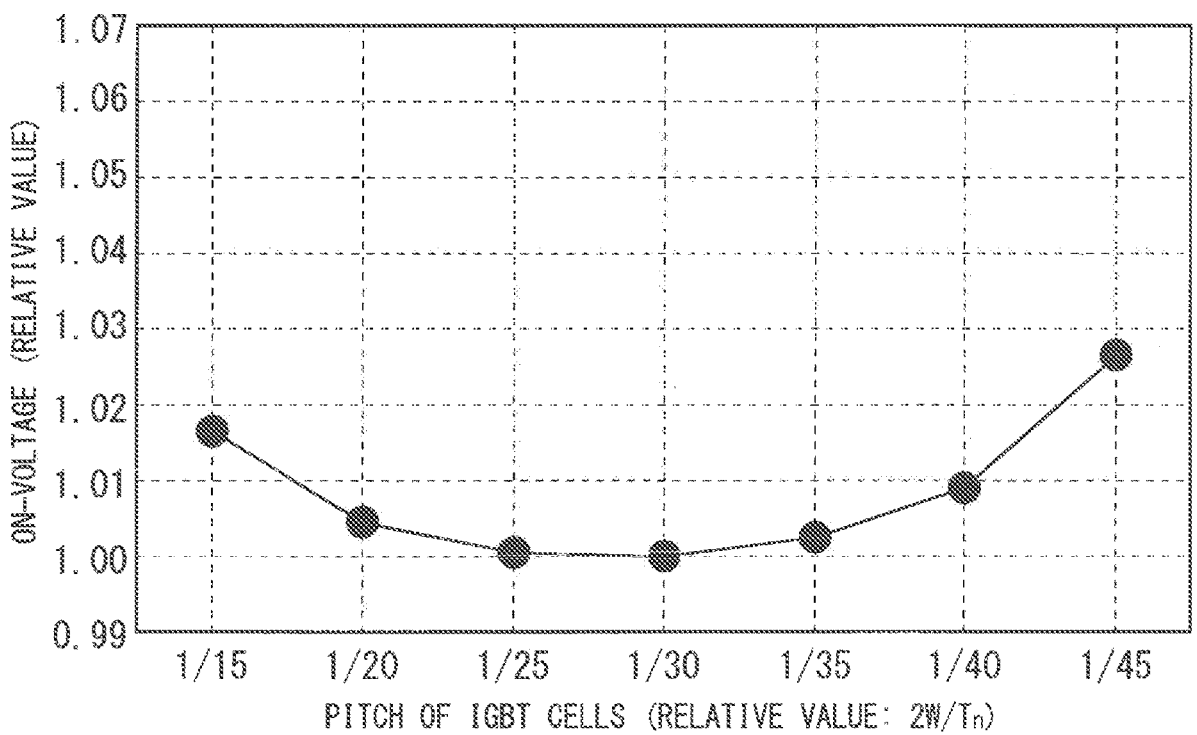

F I G. 8
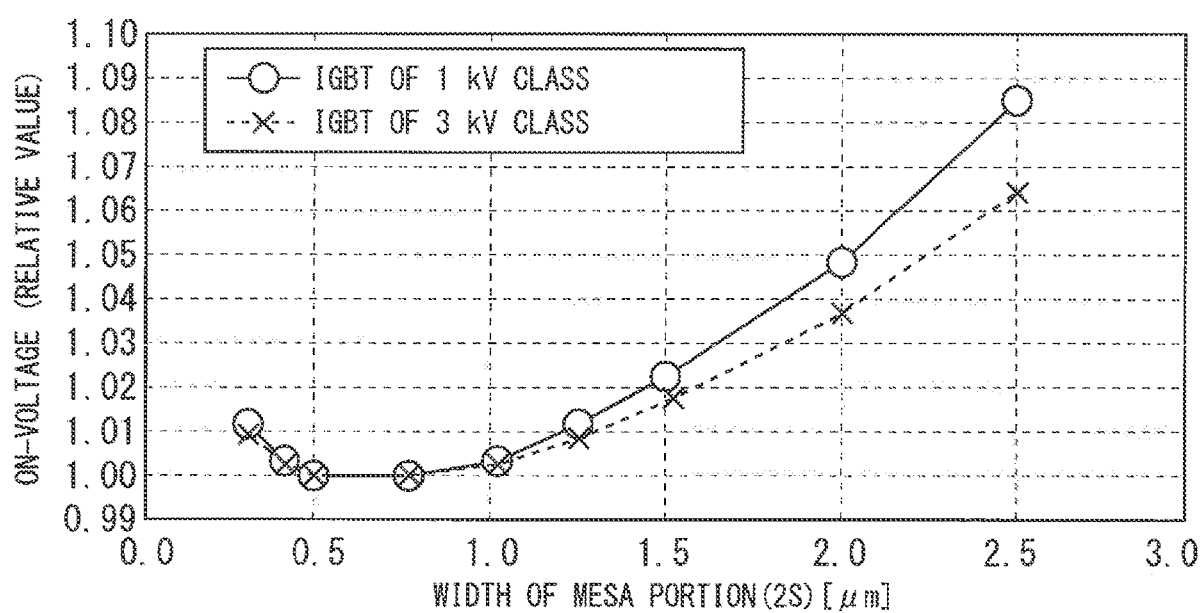

FIG. 9

| BLOCKING VOLTAGE | 1 kV CLASS | | 3 kV CLASS | |
|---|---|---|---|---|
| STRUCTURE | WITHOUT CS LAYER | WITH CS LAYER | WITHOUT CS LAYER | WITH CS LAYER |
| PITCH OF IGBT CELLS (2W) [μm] | 3.0~6.0 | 2.4~6.0 | 10.5~21.0 | 8.4~21.0 |
| WIDTH OF MESA PORTION (2S) [μm] | 0.75 | | 0.75 | |
| DEPTH OF TRENCH ($D_T$) [μm] | 6.0 | | 6.0 | |
| THICKNESS OF GATE INSULATING FILM ($T_{OX}$) [nm] | 100.0 | | 100.0 | |

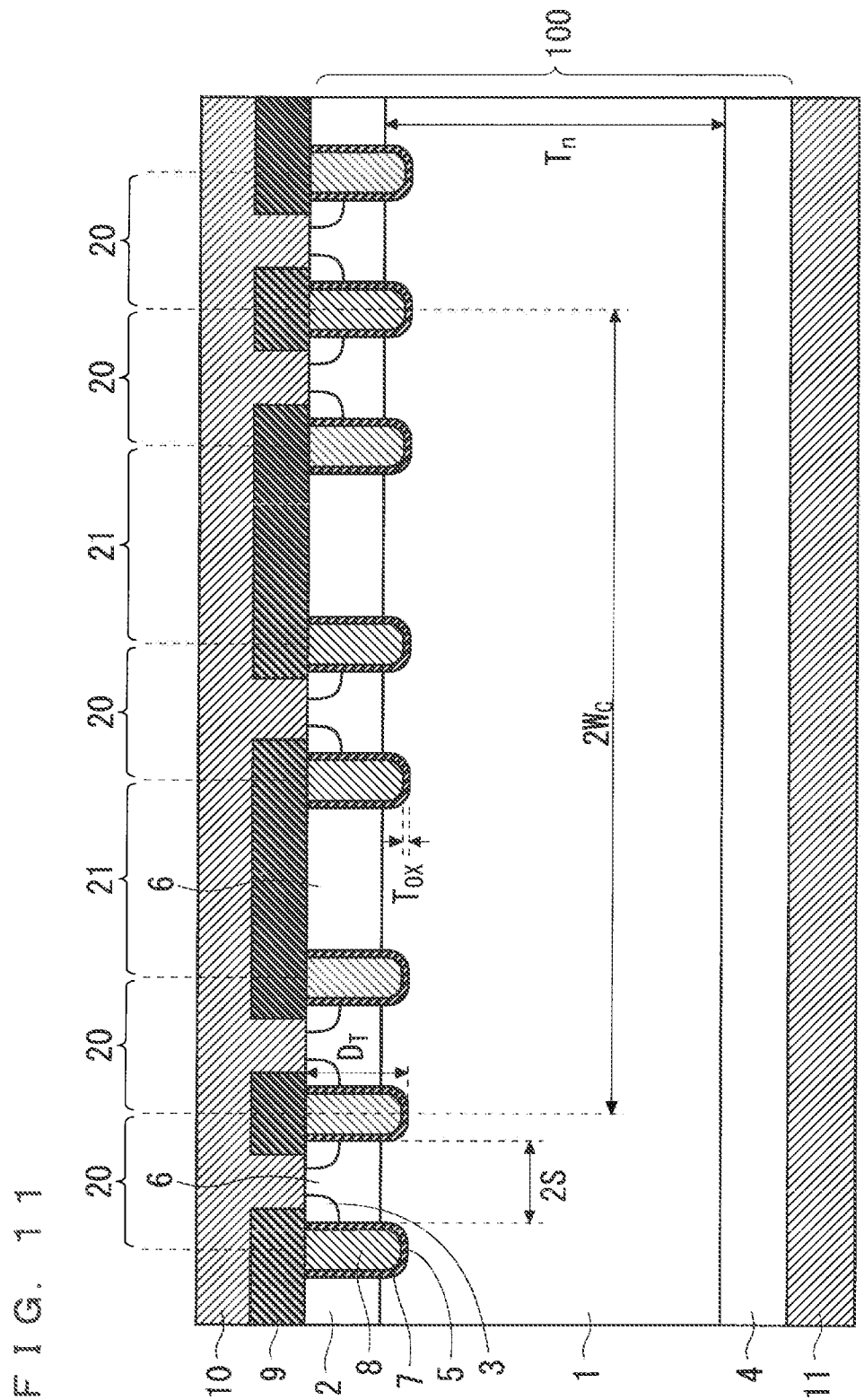

SEMICONDUCTOR DEVICE

BACKGROUND OF THE INVENTION

Field of the Invention

The present invention relates to a semiconductor device, and more particularly to a technique for reducing an on-voltage of the semiconductor device.

Description of the Background Art

An insulated gate bipolar transistor (IGBT), which is a typical switching power device, is widely used as a key component of energy-saving equipment, for example, in an inverter that performs shift control of a motor. Reduction in power loss is required of the IGBT used in the inverter or the like, and in order to realize this, reduction in an on-voltage, which is voltage drop between a collector and an emitter when the IGBT is in an on state, is required. For example, Japanese Patent No. 6288678 discloses a design method for reducing the on-voltage of the IGBT.

Although details will be described later, in order to reduce the on-voltage of the IGBT, it is important to optimize a pitch of IGBT cells in accordance with a blocking voltage of the IGBT. Specifically, it is necessary to optimize the pitch of the IGBT cells, which is a main factor that determines a density of the IGBT cells, in accordance with a thickness of a base layer, which is a main factor that determines the blocking voltage of the IGBT.

SUMMARY

An object of the present invention is to provide a semiconductor device capable of reducing an on-voltage of an IGBT in accordance with a blocking voltage (thickness of a base layer).

A semiconductor device according to the present invention includes: a semiconductor layer having a first main surface and a second main surface; and a plurality of IGBT cells formed in the semiconductor layer. Each of the plurality of IGBT cells includes: a first semiconductor region of a first conductivity type formed in the semiconductor layer; a second semiconductor region of a second conductivity type formed in a surface portion of the first semiconductor region on a side of the first main surface; a third semiconductor region of the first conductivity type formed in a surface portion of the second semiconductor region; a fourth semiconductor region of the second conductive type formed in a surface portion of the semiconductor layer on a side of the second main surface; a gate insulating film formed on the first main surface of the semiconductor layer; a gate electrode formed so as to be opposed to the first semiconductor region, the second semiconductor region, and the third semiconductor region with the gate insulating film interposed; a first main electrode formed on the first main surface of the semiconductor layer and connected to the second semiconductor region and the third semiconductor region; and a second main electrode formed on the second main surface of the semiconductor layer and connected to the fourth semiconductor region. A pitch of the plurality of IGBT cells is $1/40$ or more and $1/20$ or less of a distance between the second semiconductor region and the fourth semiconductor region.

According to the present invention, the pitch of the IGBT cells is set in accordance with the distance between the second semiconductor region and the fourth semiconductor region, which is a main factor that determines a blocking voltage of the IGBT. Therefore, the on-voltage can be lowered in IGBTs having various blocking voltages, such as the IGBTs having lower blocking voltages and the IGBTs having higher blocking voltages.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a graph showing a result from simulating a relationship between a pitch of IGBT cells and an on-voltage in the semiconductor device according to the first preferred embodiment;

FIG. 5 is a graph showing a result from simulating a relationship between a pitch of IGBT cells and an on-voltage in the semiconductor device according to the second preferred embodiment;

FIG. 7 is a graph showing a result from simulating a relationship between a pitch of IGBT cells and an on-voltage in the semiconductor device according to the third preferred embodiment;

FIG. 8 is a graph showing results from simulating relationships between a mesa width of an IGBT cell and an on-voltage;

FIG. 9 is a diagram showing a table in which main design parameters of an IGBT are summarized;

FIG. 11 is a schematic cross-sectional view of a semiconductor device according to a sixth preferred embodiment.

DESCRIPTION OF THE PREFERRED EMBODIMENTS

First Preferred Embodiment

Figure 1:
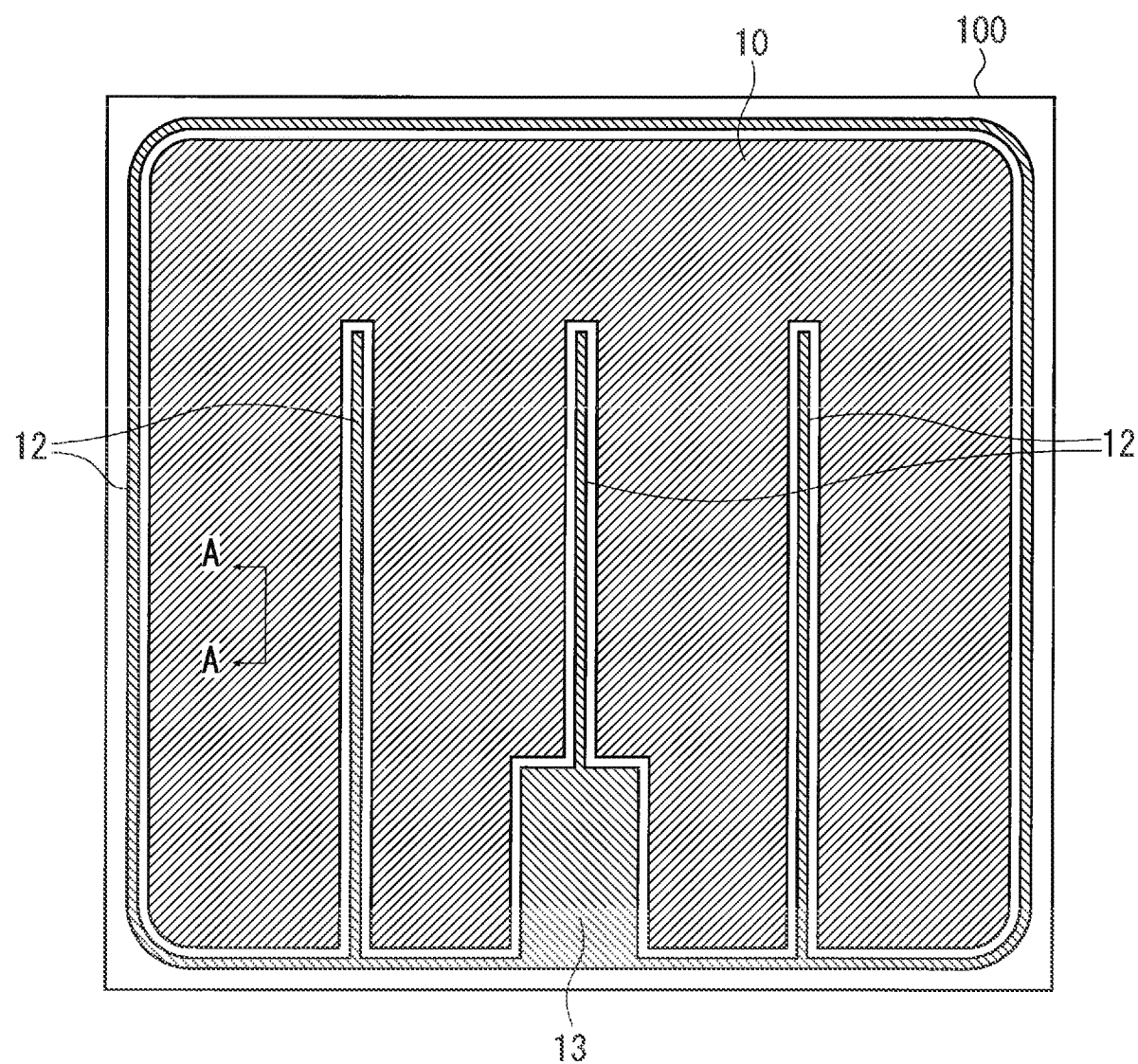
FIG. 1 is a schematic plan view of a semiconductor device according to a first preferred embodiment.
Figure 2:
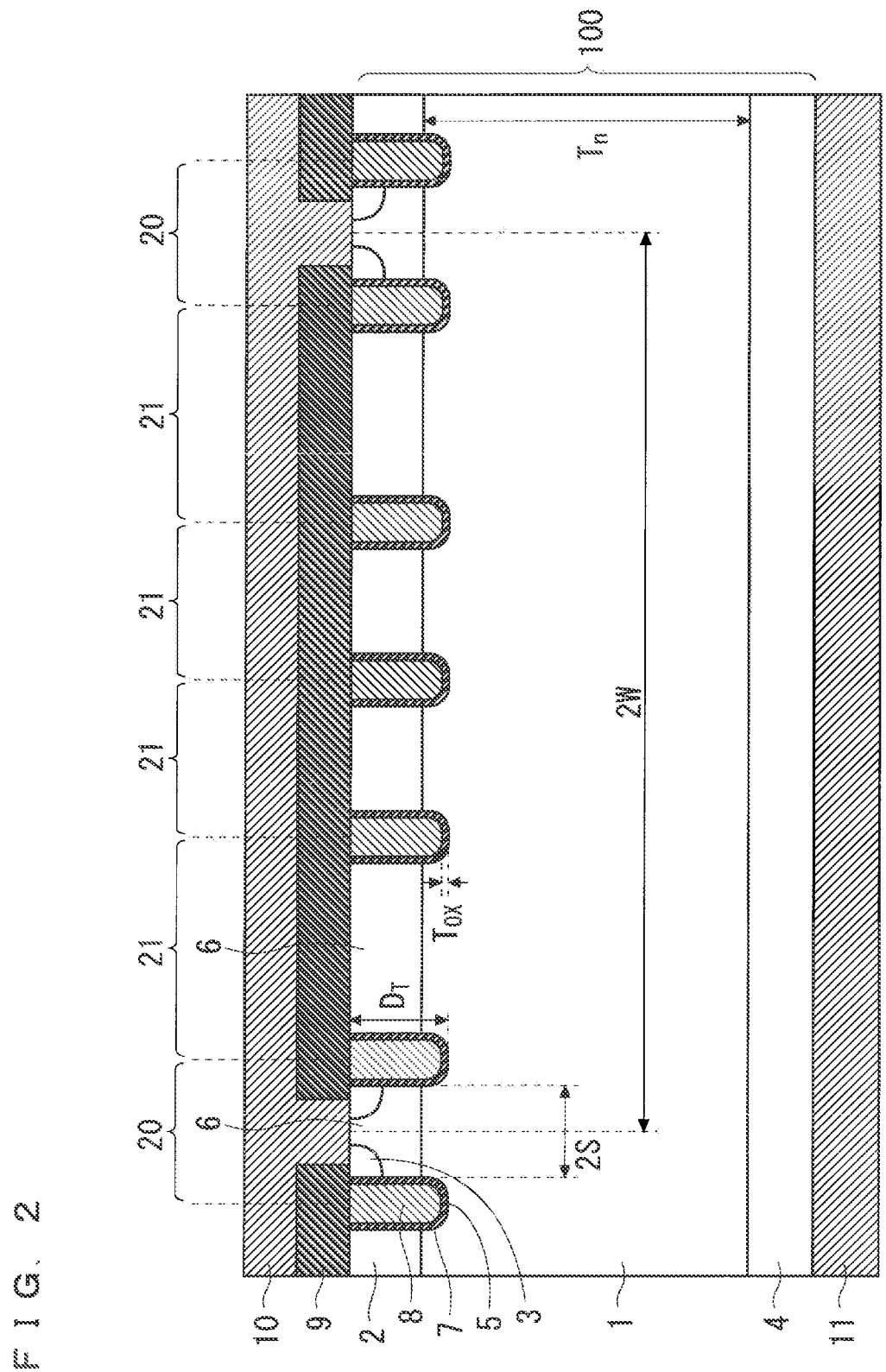
FIG. 2 is a schematic cross-sectional view of the semiconductor device according to the first preferred embodiment.

FIG. 1 is a schematic plan view of an IGBT, which is a semiconductor device according to a first preferred embodiment of the present invention. Further, FIG. 2 is a schematic cross-sectional view of a part of the semiconductor device, showing a cross section taken along a line A-A shown in FIG. 1. Here, a trench gate type IGBT is shown as an example of the IGBT, but the IGBT may be a planar gate type IGBT. Further, in the following description, while a first conductivity type is an n type and a second conductivity type is a p type, conversely, the first conductivity type may be the p type and the second conductivity type may be the n type.

The semiconductor device according to the first preferred embodiment is formed, using a semiconductor layer 100. Here, an upper surface of the semiconductor layer 100 in FIG. 2 is defined as a first main surface, and a lower surface thereof is defined as a second main surface. On most of the semiconductor layer 100, an n base layer 1 that is a first semiconductor region of a first conductivity type (n type) is formed. On a surface portion of the semiconductor layer 100 on a side of the first main surface, a p base layer 2 of a second conductivity type (p type) is formed. Further, on a surface portion of the p base layer 2, an n emitter layer 3, which is a third semiconductor region of the first conductivity type, is formed. On the other hand, in a surface portion of the semiconductor layer 100 on a side of the second main surface, a p collector layer 4, which is a fourth semiconductor region of the second conductivity type, is formed.

Further, in the surface portion of the semiconductor layer 100 on the first main surface side, trenches 5 that penetrate the n emitter layer 3 and the p base layer 2 from the first main surface and reach the n base layer 1 are formed. In the semiconductor layer 100, a region sandwiched by the trenches 5 has a mesa shape, and this mesa-shaped portion is hereinafter referred to as a "mesa portion 6".

A gate insulating film 7 is formed on the first main surface of the semiconductor layer 100 including an inside of each of the trenches 5, and a gate electrode 8 is formed on the relevant gate insulating film 7 so as to be opposed to the n base layer 1, the p base layer 2, and the n emitter layer 3 with the gate insulating film 7 interposed. That is, the gate insulating film 7 is formed on an inner surface of the trench 5, and the gate electrode 8 is buried in the trench 5 so as to be adjacent to the n emitter layer 3, the p base layer 2 below the n emitter layer 3, and the n base layer 1 below the p base layer 2 with the gate insulating film 7 interposed. As will be described later, an n type channel (n channel) is formed in a portion of the p base layer 2 adjacent to the gate electrode 8 with the gate insulating film 7 interposed when the IGBT is brought into an on state.

An interlayer insulating film 9 is formed on the first main surface of the semiconductor layer 100 so as to cover the gate electrodes 8, and an emitter electrode 10, which is a first main electrode, is formed on the interlayer insulating film 9. Contact holes reaching the p base layer 2 and the n emitter layer 3 are formed in the interlayer insulating film 9, and the emitter electrode 10 is connected to the p base layer 2 and the n emitter layer 3 through the contact holes. On the other hand, a collector electrode 11, which is a second main electrode, is formed on the second main surface of the semiconductor layer 100, and the collector electrode 11 is connected to the p collector layer 4.

The emitter electrode 10 is used as a pad (emitter pad) to which a wire or the like is connected. As shown in FIG. 1, on the first main surface of the semiconductor layer 100, gate wiring 12 and a gate pad 13 are formed in addition to the emitter electrode 10. The gate electrodes 8 are connected to the gate wiring 12 in regions not shown in FIG. 2, and are electrically connected to the gate pad 13 through the gate wiring 12. The gate wiring 12 functions so that operation of the IGBT is made uniform over an entire surface of the device by reducing a polysilicon portion of a path from each of the gate electrodes 8 to the gate pad 13 and lowering an electric resistance from the gate electrode 8 to the gate pad 13.

The IGBT is configured of the n base layer 1, the p base layer 2, the n emitter layer 3, the p collector layer 4, the gate insulating films 7, the gate electrodes 8, the emitter electrode 10, and the collector electrode 11 described above.

However, as shown in FIG. 2, the semiconductor device according to the first preferred embodiment includes cells 20 in which the n emitter layer 3 is formed in the mesa portion 6, and cells 21 in which the n emitter layer 3 is not formed in the mesa portion 6. The cell 20 in which the n emitter layer 3 is formed in the mesa portion 6 is an IGBT cell 20 that functions as an IGBT, and the cell 1 in which the n emitter layer 3 is not formed in the mesa portion 6 is a dummy cell 21 that does not function as the IGBT. That is, in the present preferred embodiment, a configuration is such that the IGBT cell 20 is a cell having all of the n base layer 1, the p base layer 2, the n emitter layer 3, the p collector layer 4, the gate insulating films 7, the gate electrodes 8, the emitter electrode 10, and the collector electrode 11, and that the dummy cell 21 has the n base layer 1, the p base layer 2, the p collector layer 4, the gate insulating films 7, the gate electrodes 8, the emitter electrode 10, and the collector electrode 11, but does not have the n emitter layer 3. Alternatively, a configuration may be such that while the dummy cell 21 includes all of the n base layer 1, the p base layer 2, the n emitter layer 3, the p collector layer 4, the gate insulating films 7, the gate electrodes 8, the emitter electrode 10, and the collector electrode 11, the n emitter layer 3 is not connected to the emitter electrode 10.

Note that in the present preferred embodiment, the semiconductor layer 100 is formed of silicon, each of the gate insulating films 7 is formed of silicon oxide ($SiO_2$), each of the gate electrodes 8 is formed of polysilicon doped with an n-type impurity, and the interlayer insulating film 9 is formed of silicate glass (BPSG) containing boron and phosphorus. Further, the emitter electrode 10, the collector electrode 11, the gate wiring 12, and the gate pad 13 are formed of aluminum (Al) containing silicon (Si). These materials are only examples. For example, the semiconductor layer 100 may be a wide band gap semiconductor, such as silicon carbide (SiC) or gallium nitride (GaN). A semiconductor device using the wide band gap semiconductor is superior in operation at high voltage, large current, and high temperature, as compared with a conventional semiconductor device using silicon.

Here, operation of the IGBT (operation of the IGBT cell 20) will be described. When a positive voltage is applied to the gate electrodes 8 with respect to the emitter electrode 10, a portion of the p base layer 2 adjacent to each of the gate electrodes 8 with each of the gate insulating films 7 interposed is inverted into the as type to form the n channel. As a result, a current path configured of the n emitter layer 3, the n channel, and the n base layer 1 is formed, and electrons having negative charges are injected into the n base layer 1 from the emitter electrode 10 through this current path. When the n base layer 1 is negatively charged by these injected electrons and a pn junction (J1 junction) configured of the p collector layer 4 and the n base layer 1 is forward biased, holes having positive charges are injected into the n base layer 1 from the collector electrode 11 through the p collector layer 4. As a result, a density of holes existing in the n base layer 1 increases, conductivity modulation occurs, and a resistance component of the n base layer 1 is largely reduced. Accordingly, even when a voltage between an emitter and a collector is low, a large collector current flows from the collector electrode 11 to the emitter electrode 10. This state is referred to as an "on state", and a voltage drop between the collector electrode 11 and the emitter electrode 10 in the on state is the on-voltage.

When the application of a positive voltage to the gate electrodes 8 with respect to the emitter electrode 10 is stopped (zero potential or a negative potential is applied to the gate electrodes 8) in the on state of the IGBT, the n channel formed in the p base layer 2 disappears, and an electron flow path from the n emitter layer 3 to the n base layer 1 disappears. Thereby, the injection of electrons from the emitter electrode 10 to the n base layer 1 is stopped, the forward bias of the J1 junction is canceled, and the injection of the holes from the collector electrode 11 to the n base layer 1 is also stopped. As a result, the conductivity modulation of the n base layer 1 is canceled, a resistance of the n base layer 1 returns to a state before the conductivity modulation occurs, and further, the pn junction (J2 junction) configured of the p base layer 2 and the n base layer 1 becomes a depletion layer, so that a voltage blocking state is brought about. This state is referred to as an "off state", and no current flows from the collector electrode 11 to the emitter electrode 10 in the off state.

The IGBT is controlled so as to repeat the on state and the off state, and functions as a switch that switches between passing and shutoff of a current to control a power supply amount.

As described above, the IGBT used as the power switch is required to reduce the on-voltage from the viewpoint of reducing the power loss. An on-voltage $V_{CEsat}$ of the IGBT is represented by the following expression (A).

$$V_{CEsat} = V_{p+n} + V_{NB} + V_{MOSFET} \tag{A}$$

In expression (A), $V_{p+n}$ is a voltage drop of the pn junction (J1 junction) between the p collector layer 4 and the n base layer 1 of the IGBT, $V_{NB}$ is a voltage drop of the n base layer 1, and $V_{MOSFET}$ is a voltage drop of a MOFET portion inside the IGBT (voltage drop of the path configured of the n emitter layer 3 and the n channel).

While $V_{p+n}$ is affected by an impurity concentration of the p collector layer 4 and the like, an influence thereof is not so large and is about 0.5 V to 0.8 V.

The $V_{NB}$ is affected by a thickness of then base layer 1 (distance between the p base layer 2 and the p collector layer 4) and the conductivity modulation. The thickness of the n-base layer 1 is a main factor that determines the blocking voltage, and when the blocking voltage of the IGBT is set high, the required thickness of the n base layer 1 becomes large and $V_{NB}$ thus becomes large. Moreover, the conductivity modulation becomes larger as a lifetime of minority carriers in then base layer 1 becomes longer, and becomes smaller as an area of the pn junction (J2 joint) between the p base layer 2 connected to the emitter electrode 10 of the IGBT cell 20, and the n base layer 1 becomes larger. This is because as the lifetime of the minority carriers of the ax base layer 1 becomes longer, the holes accumulated in the n base layer 1 increase, and as the area of the J2 junction of the IGBT cells 20 is larger, the more holes accumulated in the n base layer 1 flow into the p base layer 2 and are discharged to the emitter electrode 10, so that an amount of holes accumulated in the a base layer 1 on an emitter electrode 10 side decreases. Accordingly, when a pitch of the IGBT cells 20 is made larger, the number of repetitions of the IGBT cells 20 is decreased, a density of the IGBT cells 20 (proportion of the IGBT cells 20 with respect to an area of the first main surface of the semiconductor layer 100) becomes smaller, and the area of the J2 junction of the IGBT cells 20 becomes smaller, so that the accumulation of the holes in the n base layer 1 increases, and $V_{NB}$ can be made smaller.

The $V_{MOSFET}$ is mainly proportional to a length of the n channel, and is inversely proportional to a total distance of a width of the n channel (i.e., a density of the n channel of the IGBT cell 20×the number of the IGBT cells 20 existing in an effective area of an IGBT chip (reciprocal of the pitch of the IGBT cells 20)×width of a unit n channel). However, the length of the n channel affects the blocking voltage, and if the n channel is made too short, blocking voltage characteristics are adversely affected, such as a decrease in the blocking voltage and an increase in leakage current during voltage blocking. In addition, the width of the unit n channel is also a factor that determines a maximum value of a controllable turn-off switching current, and if the unit n channel width is made too large, turn-off operation is adversely affected, such as a turn-off failure due to a latch-up phenomenon during the turn-off operation. Therefore, there is no great likelihood in designing the length of the n channel or the width of the unit n channel. Therefore, one design point for reducing the on-voltage is the number of the IGBT cells 20 provided in the effective area of the IGBT chip.

For example, in an IGBT having a high blocking voltage of 2 kV class or higher, a ratio of $V_{NB}$ to the on-voltage ($V_{CEsat}$) is larger than a ratio of $V_{MOSFET}$ because the thickness of the n base layer 1 is large. Further, in an IGBT having a low blocking voltage of 600 V class or lower, the ratio of $V_{MOSFET}$ to the on voltage ($V_{CEsat}$) is larger than the ratio of $V_{NB}$ because the thickness of the n base layer 1 is small.

When the blocking voltage of the IGBT shown in FIG. 2 is set to 3 kV class, the thickness ($T_n$) of the n base layer 1 can be set to 420 μm, for example. FIG. 3 shows a result from simulating the on-voltage when the pitch (2W) of the IGBT cells 20 is changed from 9.3 μm to 28 μm (i.e., $2W/T_n$ is changed from ⅟45 to ⅟15) in the IGBT having this structure. A vertical axis of a graph in FIG. 3 is standardized by setting a minimum value of the on-voltage obtained by the simulation to 1.

As shown in FIG. 3, in a region where $2W/T_n$ is from ⅟20 to ⅟40, the on-voltage falls within the minimum value plus 1.0% (measurement accuracy error level). That is, in the semiconductor device of the first preferred embodiment, the pitch of the IGBT cells 20 is designed to be ⅟40 or more and ⅟20 or less of the distance between the p base layer 2 and the p collector layer 4, thereby realizing reduction of the on-voltage of the IGBT. In addition, in a region where $2W/T_n$ is from ⅟25 to ⅟35, the on voltage further becomes closer to the minimum value, and particularly, in the range where $2W/T_n$ is from ⅟25 to ⅟30, the on-voltage is almost equal to the minimum value.

As a specific example, for an IGBT of 3 kV class, it is considered that the thickness ($T_n$) of the n base layer 1 is set to 420 μm, a width (2S) of the mesa portion 6 of the IGBT cell 20 is set to 2.5 μm, and the pitch (2W) of the IGBT cells 20 is set to 12 μm. In this case, $2W/T_n$ is ⅟35, which satisfies the above design condition.

As described above, in the semiconductor device according to the present preferred embodiment, the pitch of the IGBT cells 20 is set in accordance with the thickness of the n base layer 1 (distance between the p base layer 2 and the p collector layer 4), which is the main factor that determines the blocking voltage of the IGBT. Therefore, the on-voltage can be lowered in IGBTs having various blocking voltages, such as the IGBTs having lower blocking voltages and the IGBTs having higher blocking voltages.

Here, design of the dummy cell 21 will be described. A trench density of the semiconductor layer 100 (proportion of an area of the trench 5 with respect to the area of the first main surface of the semiconductor layer 100) depends on the width of the mesa portion 6. That is, making the width of the mesa portion 6 larger makes the trench density smaller, and making the width of the mesa portion 6 smaller makes the trench density larger. When the trench density of the semiconductor layer 100 is non-uniform, an etching amount varies in etching for forming the trenches 5, and a depth of each of the trenches 5 varies, so that the voltage blocking characteristics of the IGBT becomes unstable.

If the pitch of the IGBT cells 20 is made larger without providing the dummy cells 21, the trench density of the semiconductor layer 100 becomes non-uniform. Thus, in the present preferred embodiment, providing the dummy cells 21 between the adjacent IGBT cells 20 makes the trench density uniform. Therefore, the width of the mesa portion 6 of the dummy cell 21 is preferably the equivalent to the width of the mesa portion 6 of the IGBT cell 20. Moreover, when a plurality off dummy cells 21 are disposed between the adjacent cells 20, each of the mesa portions 6 of the plurality of dummy cells 21 preferably has a uniform width. This configuration makes the trench density of the semiconductor layer 100 uniform, and the variation in the depth of the trench 5 is reduced, which can contribute to improvement in stability of the voltage blocking characteristics of the IGBT and the improvement in productivity of the IGBT.

Second Preferred Embodiment

Figure 4:
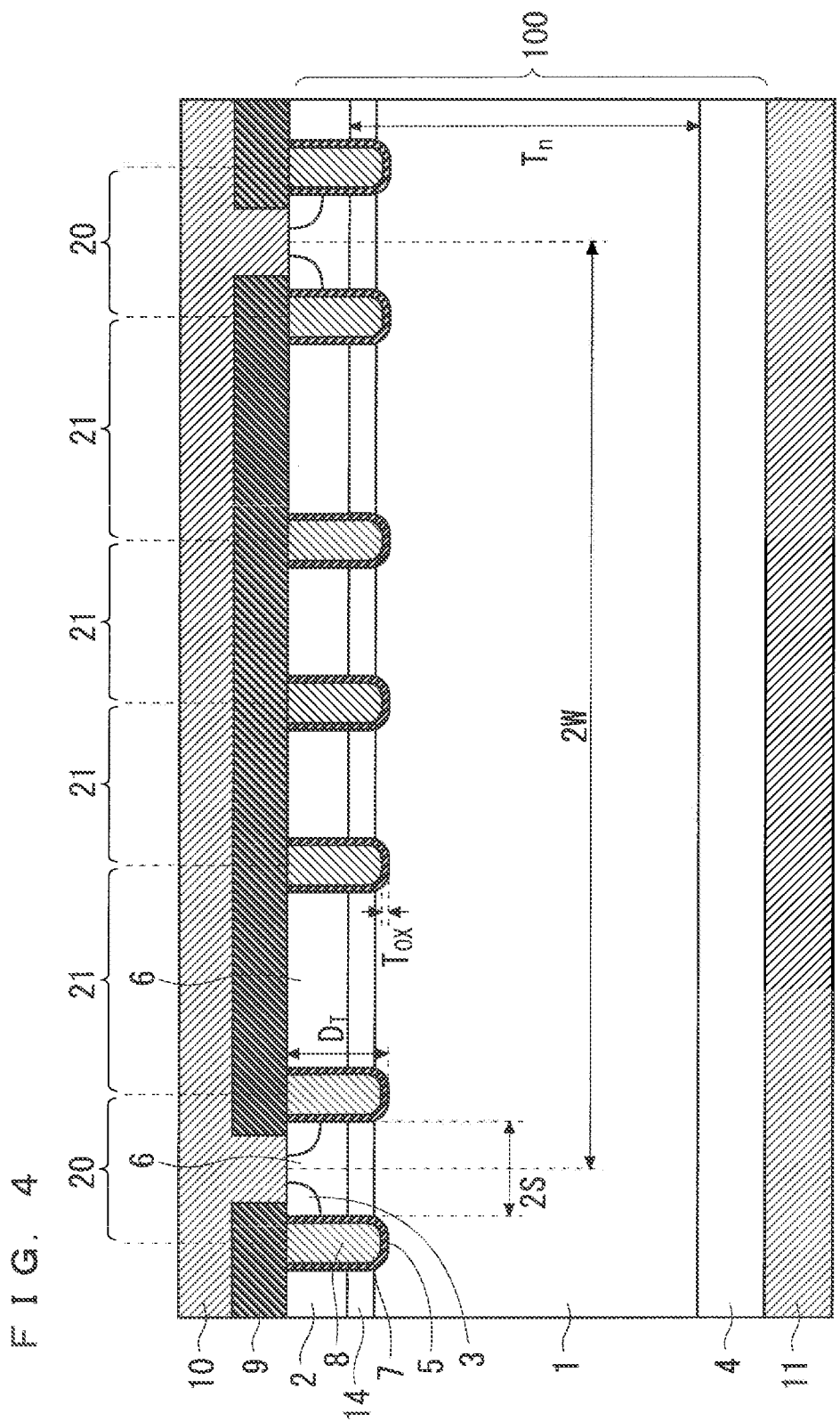
FIG. 4 is a schematic cross-sectional view of a semiconductor device according to a second preferred embodiment.

FIG. 4 is a schematic cross-sectional view of an IGBT, which is a semiconductor device according to a second preferred embodiment. The semiconductor device according to the second preferred embodiment is different from the configuration of FIG. 2 in that between the n base layer 1 and the p base layer 2, there is provided a carrier storage layer (CS layer) 14, which is a fifth semiconductor region of the first conductivity type having a higher peak concentration of impurities than the n base layer 1. Since configurations other than the carrier storage layer 14 are similar to those in FIG. 2, description thereof is omitted here.

In an IGBT having the carrier storage layer 14 between the n base layer 1 and the p base layer 2, a potential difference between the n base layer 1 and the carrier storage layer 14 generated by the carrier storage layer 14 restrains the holes in the n base layer 1 from flowing out to the p base layer 2. Therefore, the density of the IGBT cells 20 can be increased and the $V_{MOSFET}$ can be reduced without increasing $V_{NB}$.

In the present preferred embodiment, a thickness of the carrier storage layer 14 is set to about 1.5 μm. Further, as shown in FIG. 4, a distance between the p base layer 2 and the p collector layer 4, that is, a sum of the thickness of the n base layer 1 and the thickness of the carrier storage layer 14 is defined as an effective thickness ($T_n$) of the n base layer 1.

When the blocking voltage of the IGBT shown in FIG. 4 is set to 3 kV class, the effective thickness ($T_n$) of the n base layer 1 can be set to 420 μm, for example. In the IGBT having this structure, a result from simulating the on-voltage when the pitch (2W) of the IGBT cells 20 is changed from 7 μm to 28 μm (i.e., 2 W/$T_n$ is changed from 1/60 to 1/15) is shown in FIG. 5. A vertical axis of the graph in FIG. 5 is standardized by setting a minimum value of the on-voltage obtained by the simulation to 1.

As shown in FIG. 5, it can be seen that in a region where 2W/$T_n$ is from 1/20 to 1/50, the on-voltage falls within a minimum value plus 1.0% (measurement accuracy error level), and that the on-voltage is lower than that of the IGBT in the first preferred embodiment, which does not have the carrier storage layer 14. That is, in the semiconductor device of the second preferred embodiment, the pitch of the IGBT cells 20 is designed to be 1/50 or more and 1/20 or less of the distance between the p base layer 2 and the p collector layer 4, thereby realizing the reduction of the on-voltage of the IGBT. In addition, in a region where 2W/$T_n$ is from 1/25 to 1/45, the on-voltage further becomes closer to the minimum value, and particularly, in a region where 2W/$T_n$ is from 1/30 to 1/40, the on-voltage becomes almost equal to the minimum value.

As described above, in the semiconductor device according to the present preferred embodiment, the pitch of the IGBT cells 20 is set in accordance with the effective thickness of the n base layer 1 (distance between the p base layer 2 and the p collector layer 4), which is a main factor that determines the blocking voltage of the IGBT. Therefore, the on-voltage can be lowered in IGBTs having various blocking voltages, such as the IGBTs having lower blocking voltages and the IGBTs having higher blocking voltages.

Third Preferred Embodiment

Figure 6:
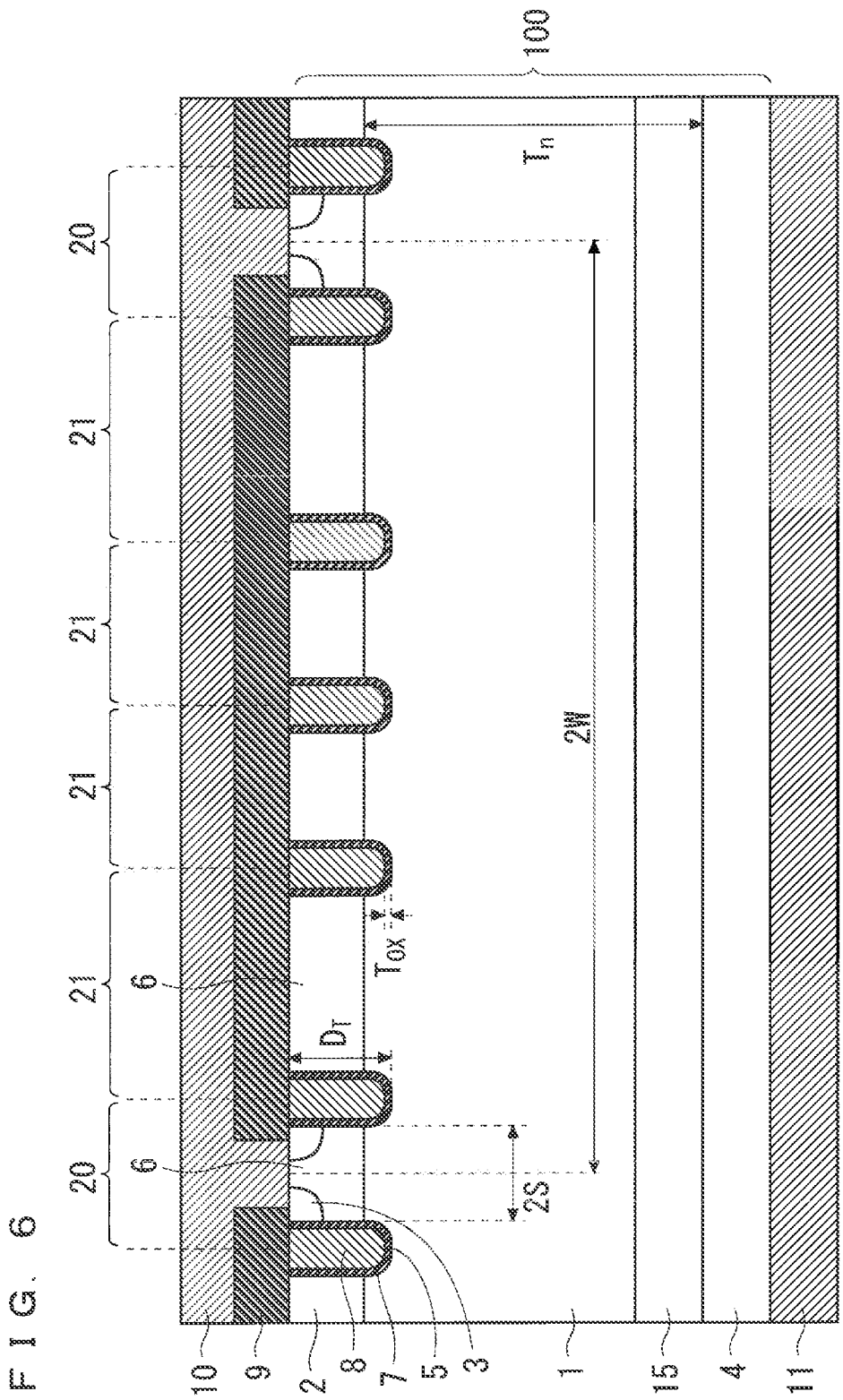
FIG. 6 is a schematic cross-sectional view of a semiconductor device according to a third preferred embodiment.

FIG. 6 is a schematic cross-sectional view of an IGBT, which is a semiconductor device according to a third preferred embodiment. The semiconductor device according to the third preferred embodiment is different from the configuration of FIG. 2 in that between the n base layer 1 and the p collector layer 4, there is provided a buffer layer 15, which is a sixth semiconductor region of the first conductivity type having a higher peak concentration of impurities than the n base layer 1. Since the configurations other than the buffer layer 15 are similar to those of FIG. 2, description thereof is omitted here.

In the present preferred embodiment, as shown in FIG. 6, a distance between the p base layer 2 and the p collector layer 4, that is, a sum of the thickness of the n base layer 1 and a thickness of the buffer layer 15 is defined as an effective thickness ($T_n$) of the n base layer 1. In an IGBT having the buffer layer 15 between the n base layer 1 and the p collector layer 4, the effective thickness ($T_n$) of the n base layer 1 can be made thinner, so that $V_{NB}$ can be reduced and the on-voltage can be made smaller.

When the blocking voltage of the IGBT shown in FIG. 6 is set to the 1 kV class, the effective thickness ($T_n$) of the n base layer 1 can be set to 120 μm, for example. In the IGBT having this structure, a result from simulating the on-voltage when the pitch (2W) of the IGBT cells 20 is changed from 2.7 μm to 8 μm (i.e., 2W/$T_n$ is changed from 1/45 to 1/15) is shown in FIG. 7. A vertical axis of a graph in FIG. 7 is standardized by setting a minimum value of the on-voltage obtained by the simulation to 1.

As shown in FIG. 7, in a region where 2W/$T_n$ is from 1/20 to 1/40, the on-voltage falls within the minimum value plus 1.0% (measurement accuracy error level). That is, in the semiconductor device of the third preferred embodiment, the pitch of the IGBT cells 20 is designed to be 1/40 or more and 1/20 or less of the distance between the p base layer 2 and the p collector layer 4, thereby realizing the reduction of the on-voltage of the IGBT. In addition, in a region where 2W/$T_n$ is from 1/25 to 1/35, the on voltage further becomes closer to the minimum value, and particularly, in a region where 2W/$T_n$ is from 1/25 to 1/30, the on-voltage becomes almost equal to the minimum value.

These results are similar to those described with reference to FIG. 3 in the first preferred embodiment. From the foregoing, it can be seen that the method of setting the pitch of the IGBT cells 20 in accordance with the effective thickness of the n base layer 1 (distance between the p base layer 2 and the p collector layer 4) lowers the on-voltage in the IGBTs having various blocking voltages.

As a specific example, in the case of an IGBT of 1 kV class, it is considered that the effective thickness ($T_n$) of the n base layer 1 is set to 120 μm, the width (2S) of the mesa portion 6 of the IGBT cell 20 is set to 1.5 μm, and the pitch (2W) of the IGBT cells 20 is set to 6 μm. In this case, 2W/T$_n$ is 1/20, which satisfies the above design condition.

As described above, in the semiconductor device according to the present preferred embodiment, the pitch of the IGBT cells 20 is set in accordance with the effective thickness of the n base layer 1 (distance between the p base layer 2 and the p collector layer 4), which is a main factor that determines the blocking voltage of the IGBT. Therefore, the on-voltage can be lowered in IGBTs having various blocking voltages, such as the IGBTs having lower blocking voltages and the IGBTs having higher blocking voltages.

Fourth Preferred Embodiment

As described above, when the density of the IGBT cells 20 is made smaller and the area of the J2 junction is made smaller, the accumulation of the holes in the n base layer 1 is increased and V$_{NB}$ can be made smaller. In other words, making the width (2S) of the mesa portion 6 of the IGBT cell 20 smaller is effective in making V$_{NB}$ smaller. However, if the width of the mesa portion 6 of the IGBT cell 20 is excessively narrowed, a contact area between the emitter electrode 10 and the n emitter layer 3 becomes smaller and the contact resistance is increased, which causes an increase in the on-voltage. In a fourth preferred embodiment, a preferable range of the width of the mesa portion 6 of the IGBT cell 20 will be described.

FIG. 8 is a graph showing results of simulating relationships between the width of the mesa portion 6 of the IGBT cell 20 and the on-voltage. FIG. 8 shows a result from simulating the on-voltage when the mesa width is changed from 0.3 μm to 2.5 μm in an IGBT of a 1 kV class having the effective thickness (T$_n$) of the n base layer 1 of 120 μm, the IGBT having the buffer layer 15 and not having the carrier storage layer 14, and a result from simulating the on-voltage when the mesa width is similarly changed from 0.3 μm to 2.5 μm in an IGBT of 3 kV class having the carrier storage layer 14 and not having the buffer layer 15. A vertical axis of the graph in FIG. 8 is standardized by setting a minimum value of the on-voltage obtained by the simulation to 1.

As can be seen from the graph of FIG. 8, the on-voltage falls within the minimum value plus 1.0% in a region where the width of the mesa portion 6 is 0.4 μm or more and 1 μm or less not only in the IGBT of 1 kV class but also in the IGBT of 3 kV class, in which the thickness of the n base layer 1 is several times that of the IGBT of 1 kV class. That is, when the width of the mesa portion 6 is set in the range of 0.4 μm or more and 1 μm or less, the on-voltage of the IGBT can be reduced.

FIG. 9 shows an example of main design parameter values for the IGBTs of 1 kV class and 3 kV class designed, using the above-described design method.

Fifth Preferred Embodiment

Figure 10:
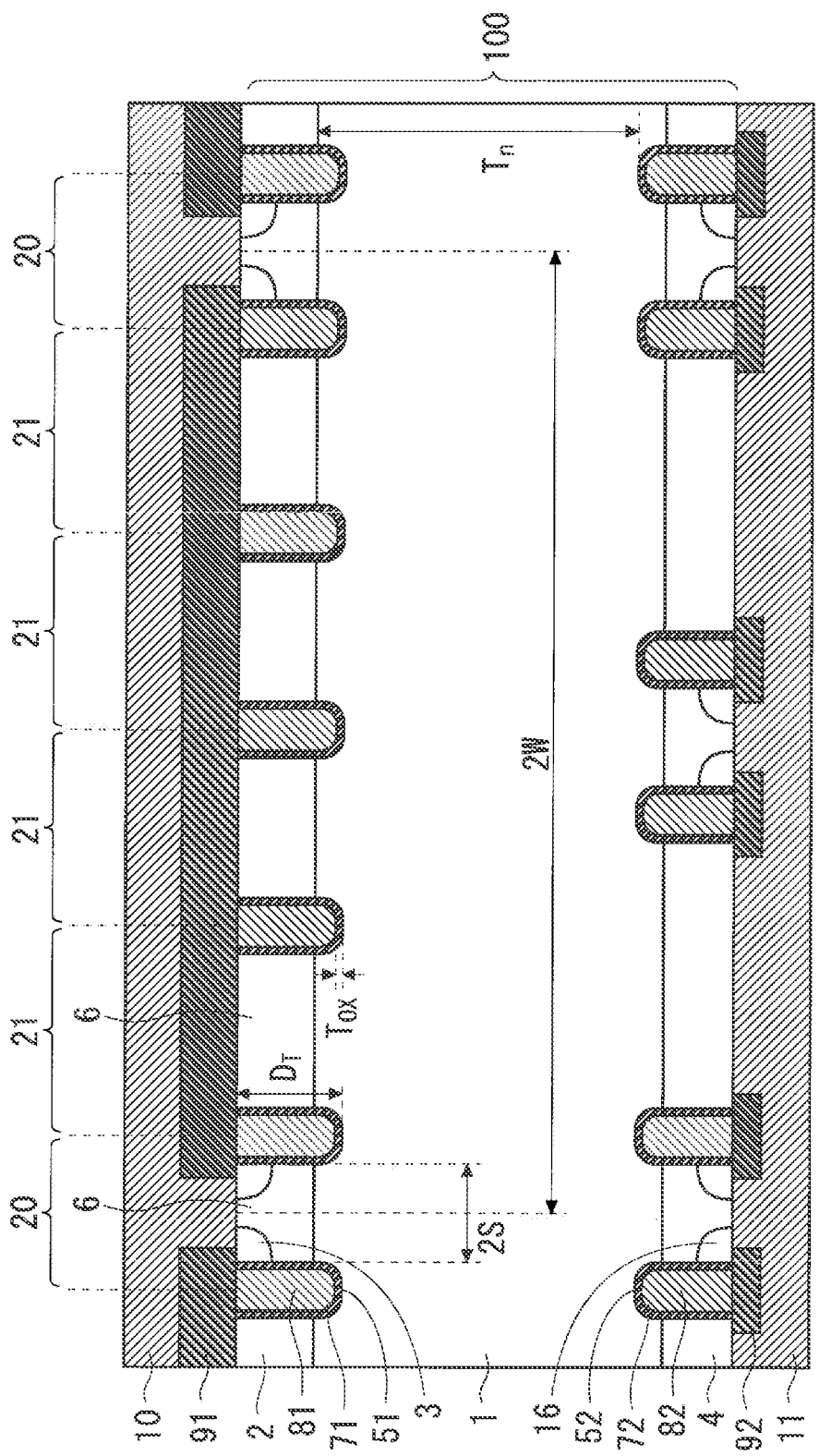
FIG. 10 is a schematic cross-sectional view of a semiconductor device according to a fifth preferred embodiment.

FIG. 10 is a schematic cross-sectional view of a double-sided gate structure IGBT, which is a semiconductor device according to a fifth preferred embodiment. The semiconductor device according to the fifth preferred embodiment is also formed, using the semiconductor layer 100 in which the n base layer 1, the p base layer 2, the n emitter layer 3, and the p collector layer 4 are formed, as in the first preferred embodiment.

In the surface portion of the semiconductor layer 100 on the first main surface side, first trenches 51 that penetrate the n emitter layer 3 and the p base layer 2 from the first main surface and reach the n base layer 1 are formed, and the mesa portion 6 is formed in each region sandwiched by the first trenches 51.

First gate insulating films 71 are formed on the first main surface of the semiconductor layer 100 including insides of the first trenches 51, and a first gate electrode 81 is formed on each of the first gate insulating films 71 so as to be opposed to the n base layer 1, the p base layer 2, and the a emitter layer 3 with the first gate insulating film 71 interposed. That is, each of the first gate insulating films 71 is formed on an inner surface of each of the first trenches 51, and each of the first gate electrodes 81 is buried in the first trench 51 so as to be adjacent to the n emitter layer 3, the p base layer 2 below the n emitter layer 3, and the n base layer 1 below the p base layer 2 with the first gate insulating film 71 interposed.

A first interlayer insulating film 91 is formed on the first main surface of the semiconductor layer 100 so as to cover e first gate electrodes 81, and the emitter electrode 10, which is the first main electrode, is formed on the first interlayer insulating film 91. Contact holes reaching the p base layer 2 and the n emitter layer 3 are formed in the first interlayer insulating film 91, and the emitter electrode 10 is connected to the p base layer 2 and the n emitter layer 3 through the contact holes.

On the other hand, on the second main surface side of the semiconductor layer 100, an n collector layer 16, which is the fifth semiconductor region of the first conductivity type, is formed in the surface portion of the p collector layer 4. Moreover, in the surface portion of the semiconductor layer 100 on the second main surface side, second trenches 52 that penetrate the n collector layer 16 and the p collector layer 4 from the second main surface and reach the n base layer 1 are formed.

Second gate insulating films 72 are formed on the second main surface of the semiconductor layer 100 including insides of the second trenches 52, and a second gate electrode 82 is formed on each of the second gate insulating films 72 so as to be opposed to the n collector layer 16, the p collector layer 4, and the n emitter layer 3 with the second gate insulating film 72 interposed. That is, the second gate insulating film 72 is formed on an inner surface of the second trench 52, and the second gate electrode 82 is buried in the second trench 52 so as to be adjacent to the n collector layer 16, the p collector layer 4 above the n collector layer 16, and the n base layer 1 above the p collector layer 4 with the second gate insulating film 72 interposed.

A second interlayer insulating film 92 is formed on the second main surface of the semiconductor layer 100 so as to cover the second gate electrodes 82, and the collector electrode 11 is formed on the second interlayer insulating film 92. Contact holes reaching the n collector layer 16 and the p collector layer 4 are formed in the second interlayer insulating film 92, and the collector electrode 11 is connected to the n collector layer 16 and the p collector layer 4 through the contact holes.

Further, also in the semiconductor device according to the fifth preferred embodiment, similarly to the first preferred embodiment, the IGBT cells 20 that function as the IGBT and the dummy cells 21 that do not function as the IGBT are provided.

The IGBT cell 20 of the fifth preferred embodiment can switch between an on state and an off state in accordance with a voltage signal supplied to the first gate electrode 81, and further can switch between conduction and non-conduction between the n base layer 1 and the collector electrode 11 in accordance with a voltage signal supplied to the second gate electrode 82. By controlling discharge of the electrons and the holes accumulated in the n base layer 1 by the voltage signal supplied to the second gate electrode 82, a switching time of the IGBT cell 20 can be shortened. Note that in the fifth preferred embodiment, the effective thickness ($T_n$) of the n base layer 1 is a distance between the p base layer 2 and the second trenches 52.

Even in the above-described IGBT having the double-sided gate structure, a hole accumulation phenomenon in the n base layer 1 in the on state is affected by the pitch of the IGBT cells 20, the thickness of the n base layer 1, and the width of the mesa portion 6 as in a normal IGBT. Therefore, the preferable ranges of $2W/T_n$ and the preferable ranges of the width of the mesa portion 6 described in the first to fifth preferred embodiments are also effective for the IGBT having the double-sided gate structure.

Sixth Preferred Embodiment

FIG. 11 is a schematic cross-sectional view of an IGBT, which is a semiconductor device according to a sixth preferred embodiment. While in the IGBT of FIG. 2, an interval between the adjacent IGBT cells 20 is constant, the interval may not be constant. For example, in the IGBT in FIG. 11, there exist a portion where the dummy cell 21 is provided between the adjacent IGBT cells 20 and a portion where the adjacent IGBT cells 20 are directly arranged. However, it is assumed that the IGBT cells 20 are arrayed in a periodic (regular) repeating pattern.

When the IGBT cells 20 are arrayed in the periodic repeating pattern, a pitch of the repeating pattern is $2W_C$, and the number of the IGBT cells 20 included in one repeating pattern is $C_N$, an effective pitch $2W_A$ of the IGBT cells 20 can be defined as $2W_C/C_N$ from a viewpoint of a density of the IGBT cells 20. The effective pitch $2W_A$ of the IGBT cells 20 can be regarded as equivalent to the pitch (2W) of the IGBT cells 20 in the first to sixth preferred embodiments. In other words, by treating the effective pitch $2W_A$ of the IGBT cells 20 similarly to the pitch of the IGBT cells 20 in the first to sixth preferred embodiments, the first to sixth preferred embodiments can be applied to the semiconductor device in which the IGBT cells 20 are arrayed in the periodic repeating pattern.

In the present invention, within the scope of the invention, each of the preferred embodiments can be freely combined, and each of the preferred embodiments can be appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a semiconductor layer having a first main surface and a second main surface; and
    a plurality of IGBT cells formed in the semiconductor layer,
    wherein
    each of the plurality of IGBT cells includes:
        a first semiconductor region of a first conductivity type formed in the semiconductor layer;
        a second semiconductor region of a second conductivity type formed in a surface portion of the first semiconductor region on a side of the first main surface;
        a third semiconductor region of the first conductivity type formed in a surface portion of the second semiconductor region;
        a fourth semiconductor region of the second conductive type formed in a surface portion of the semiconductor layer on a side of the second main surface;
        a gate insulating film formed on the first main surface of the semiconductor layer;
        a gate electrode formed so as to be opposed to the first semiconductor region, the second semiconductor region, and the third semiconductor region with the gate insulating film interposed;
        a first main electrode formed on the first main surface of the semiconductor layer and connected to the second semiconductor region and the third semiconductor region; and
        a second main electrode formed on the second main surface of the semiconductor layer and connected to the fourth semiconductor region, and
    a pitch of the plurality of IGBT cells is $1/40$ or more and $1/20$ or less of a distance between the second semiconductor region and the fourth semiconductor region.

2. The semiconductor device according to claim 1, further comprising a dummy cell disposed between the IGBT cells and not operating as an IGBT.

3. The semiconductor device according to claim 1, wherein
    the semiconductor layer includes trenches that penetrate the third semiconductor region and the second semiconductor region and reach the first semiconductor region,
    the gate insulating film is formed on an inner surface of each of the trenches, and
    the gate electrode is buried in each of the trenches.

4. The semiconductor device according to claim 3, wherein in each of the plurality of IGBT cells, a width of a mesa portion of the semiconductor layer is 0.4 μm or more and 1 μm or less, the mesa portion being sandwiched between the trenches.

5. The semiconductor device according to claim 1, wherein
    the plurality of IGBT cells are arrayed in periodically repeated patterns, and
    the pitch of the plurality of IGBT cells is defined as $2W_C/C_N$, where $2W_C$ is a pitch of the repeated patterns and $C_N$ is the number of the IGBT cells included in each of the repeated patterns.

6. The semiconductor device according to claim 1, further comprising a sixth semiconductor region of the first conductivity type disposed between the first semiconductor region and the fourth semiconductor region and having a higher peak concentration of the impurity than the first semiconductor region.

7. The semiconductor device according to claim 1, further comprising a second gate electrode capable of switching between conduction and non-conduction between the first semiconductor region and the second main electrode.

8. A semiconductor device comprising:
    a semiconductor layer having a first main surface and a second main surface; and
    a plurality of IGBT cells formed in the semiconductor layer,
    wherein
    each of the plurality of IGBT cells includes:
        a first semiconductor region of a first conductivity type formed in the semiconductor layer;

a second semiconductor region of a second conductivity type formed in a surface portion of the first semiconductor region on a side of the first main surface;

a third semiconductor region of the first conductivity type formed in a surface portion of the second semiconductor region;

a fourth semiconductor region of the second conductive type formed in a surface portion of the semiconductor layer on a side of the second main surface;

a fifth semiconductor region of the first conductive type disposed between the first semiconductor region and the second semiconductor region, and having a higher peak concentration of an impurity than the first semiconductor region;

a gate insulating film formed on the first main surface of the semiconductor layer;

a gate electrode formed so as to be opposed to the first semiconductor region, the second semiconductor region, and the third semiconductor region with the gate insulating film interposed;

a first main electrode formed on the first main surface of the semiconductor layer, and connected to the second semiconductor region and the third semiconductor region; and a second main electrode formed on the second main surface of the semiconductor layer, and connected to the fourth semiconductor region, and a pitch of the plurality of IGBT cells is 1/50 or more, and 1/20 or less of a distance between the second semiconductor region and the fourth semiconductor region.

9. The semiconductor device according to claim 8, further comprising a dummy cell disposed between the IGBT cells and not operating as an IGBT.

10. The semiconductor device according to claim 8, wherein the semiconductor layer includes trenches that penetrate the third semiconductor region and the second semiconductor region, and reach the first semiconductor region, the gate insulating film is formed on an inner surface of each of the trenches, and the gate electrode is buried in each of the trenches.

11. The semiconductor device according to claim 10, wherein in each of the plurality of IGBT cells, a width of a mesa portion of the semiconductor layer is 0.4 µm or more and 1 µm or less, the mesa portion being sandwiched between the trenches.

12. The semiconductor device according to claim 8, wherein the plurality of IGBT cells are arrayed in periodically repeated patterns, and the pitch of the plurality of IGBT cells is defined as $2W_C/C_N$, where $2W_C$ is a pitch of the repeated patterns and $C_N$ is the number of the IGBT cells included in each of the repeated patterns.

13. The semiconductor device according to claim 8, further comprising a sixth semiconductor region of the first conductivity type disposed between the first semiconductor region and the fourth semiconductor region and having a higher peak concentration of the impurity than the first semiconductor region.

14. The semiconductor device according to claim 8, further comprising a second gate electrode capable of switching between conduction and non-conduction between the first semiconductor region and the second main electrode.

* * * * *